(12) United States Patent
Bedell et al.

(10) Patent No.: US 8,823,143 B2
(45) Date of Patent: Sep. 2, 2014

(54) ELECTRODEPOSITION METHOD FOR FORMING GE ON SEMICONDUCTOR SUBSTRATES

(75) Inventors: Stephen W. Bedell, Wappingers Falls, NY (US); Hariklia Deligianni, Tenafly, NJ (US); Qiang Huang, Sleepy Hollow, NY (US); Lubomyr T. Romankiw, Briarcliff Manor, NY (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 742 days.

(21) Appl. No.: 12/541,499

(22) Filed: Aug. 14, 2009

(65) Prior Publication Data

US 2009/0302353 A1    Dec. 10, 2009

Related U.S. Application Data

(62) Division of application No. 11/620,224, filed on Jan. 5, 2007, now Pat. No. 7,785,982.

(51) Int. Cl.
*H01L 21/02* (2006.01)

(52) U.S. Cl.
USPC ........... 257/616; 257/742; 438/408; 438/441; 438/497

(58) Field of Classification Search
USPC .......... 257/616, 742, E21.174; 438/408, 441, 438/497
See application file for complete search history.

(56) References Cited

U.S. PATENT DOCUMENTS

| | | | |
|---|---|---|---|
| 2,690,422 A | 9/1954 | Szekely | |
| 4,806,996 A * | 2/1989 | Luryi | 257/190 |
| 5,270,229 A | 12/1993 | Ishihara | |
| 7,221,006 B2 * | 5/2007 | Orlowski et al. | 257/192 |
| 2004/0127012 A1 | 7/2004 | Jin | |

FOREIGN PATENT DOCUMENTS

DE    19522054    11/1996

OTHER PUBLICATIONS

Sharma et al., "Optical Properties of Ge Nanowires Grown on Silicon (100) and (111) Substrates", Materials Research Society Symposium Proceedings, vol. 832, pp. 329-334, 2005.
Dailey et al., "Vapor-liquid-solid growth of germanium nanostructures on silicon", Journal of Applied Physics, vol. 96, No. 12, pp. 7556-7567, 2004.
Schuessler et al., "Electrochemical Deposition of Pd, Ti, and Ge for Applications in GaAs Technology", Journal of the Electrochemical Society, vol. 143, No. 4, pp. L73-L75, 1996.
Saitou et al., "Evaluation of crystalline germanium thin films electrodeposited on copper substrates from propylene glycol electrolyte", Surface and Coatings Technology, vol. 162, pp. 101-105, 2002.

* cited by examiner

*Primary Examiner* — Jarrett Stark
*Assistant Examiner* — John M Parker
(74) *Attorney, Agent, or Firm* — Novak Druce Connolly Bove + Quigg LLP; Louis J. Percello, Esq.

(57) ABSTRACT

Methods for electrodepositing germanium on various semiconductor substrates such as Si, Ge, SiGe, and GaAs are provided. The electrodeposited germanium can be formed as a blanket or patterned film, and may be crystallized by solid phase epitaxy to the orientation of the underlying semiconductor substrate by subsequent annealing. These plated germanium layers may be used as the channel regions of high-mobility channel field effect transistors (FETs) in complementary metal oxide semiconductor (CMOS) circuits.

13 Claims, 10 Drawing Sheets

ELECTRODEPOSITION METHOD FOR FORMING GE ON SEMICONDUCTOR SUBSTRATES

CROSS REFERENCE TO RELATED APPLICATIONS

The present application is divisional of application Ser. No. 11/620,224, now U.S. Pat. No. 7,785,982, filed on Jan. 5, 2007, which is related to U.S. patent application Ser. No. 11/620,391, now U.S. Pat. No 7,659,200, filed on Jan. 5, 2007, entitled "Self-Constrained Anisotropic Germanium Nanostructure from Electroplating" and is assigned to International Business Machines Corporation, the assignee of the present application. The entire contents of each U.S. patent application is incorporated herein by reference for all purposes.

TECHNICAL FIELD

This disclosure generally relates to electrochemical methods for depositing germanium (Ge) and more particularly relates to the electrodeposition of germanium on crystalline semiconductors to form regions of epitaxial germanium. This disclosure further relates to semiconductor devices incorporating electroplated germanium films.

BACKGROUND

Improvements in semiconductor field-effect transistors (FETs) have traditionally been implemented by scaling down the relative dimensions of the device. However, because of fundamental scaling limits, advanced field-effect transistors and the complementary metal oxide semiconductor (CMOS) circuits in which they can be found are increasingly relying on nontraditional materials and special substrate geometries to achieve desired improvements in circuit performance. High-mobility channel field-effect transistors in which the channel material comprises a high-mobility material such as germanium instead of the traditional silicon are one example of a type of field-effect transistor incorporating nontraditional materials. Germanium-channel devices are expected to provide significant performance advantages since electron and hole mobilities are two to four times higher in germanium than in silicon. Typically the germanium layer that would become the channel would be epitaxially grown on an underlying layer of silicon or a silicon-containing semiconductor.

There are many challenges in growing epitaxial layers of germanium on silicon. Germanium layers grown directly on silicon must be thin because the critical thickness for films with the 4% lattice mismatch of silicon and germanium is only a few nanometers. Films exceeding this critical thickness spontaneously form dislocations to relieve the strain, consequently degrading their value as device layers.

Epitaxial germanium films grown directly on silicon are typically formed by techniques such as rapid thermal chemical vapor deposition (RTCVD) and ultra-high-vacuum CVD (UHVCVD). A problem with these techniques is that the deposition rates at the early stages of film growth are highly variable, depending sensitively on the cleanliness of the silicon growth surface and the degree to which the growth surface is covered by germanium adsorbed from the process gas mixture. It is therefore nearly impossible to reliably grow a thin germanium film to a specified thickness. An additional problem is that thin germanium films tend to have an island structure at early stages of growth, which leaves them rough and discontinuous right in the thickness range of interest for device applications. While thick films could be grown and then thinned, thick films are invariably rough and contain defects that propagate back to the bottom-most portion of the film.

In principle, thin and smooth layers of germanium may be formed on silicon by deposition methods such as sputter deposition, evaporation, and plasma-enhanced chemical vapor deposition (PECVD), and then crystallized using the silicon substrate as a template. However, the silicon/germanium interface is usually too contaminated to provide a good surface for recrystallization and these methods are inherently spatially non-selective (e.g., same deposition rate on silicon and silicon oxide).

There have been some limited suggestions of electrodeposition of germanium on metals. However, the attempts have not been especially successful. This may be due to the high instability of the germanium chemistry and, at the same time the very low hydrogen overpotential on germanium surfaces. Therefore, all the plating current is used for the proton reduction (side reaction) and no germanium electroplating once a limited amount of Ge is formed on the electrode surface has been reported.

For instance, plating of germanium on metal substances has been reported in alkaline aqueous solution [see Fink et al., Journal of the Electrochemical Society, vol. 95 (1948)] and in glycol solutions [see Szekely, Journal of the Electrochemical Society, vol. 98, p. 318 (1951) and U.S. Pat. No. 2,690,422 to Szekely]. More recently, some studies have been reported which were directed to germanium nucleation studies from ionic liquid media, for example, butyl-methyl-immidazolium hexafluorophosphate. [see Endres, Electrochemical and Solid State Letters, vol. 5, p. C38 (2002); Endres et al., Physical Chemistry and Chemical Physics, vol. 4, p. 1640 (2002); and Endres Physical Chemistry and Chemical Physics, vol. 4, p. 1649 (2002)].

In the aqueous approach, an extremely alkaline solution (pH>13) was used to minimize the proton concentration and therefore suppress the reduction of proton. This approach is not compatible with most microelectronics processes due to the extremely high pH of the electrolyte, which causes damage to most of the structures that are built from silicon oxide and other dielectrics and used in the fabrication of electronic devices.

In the non-aqueous solution approaches, where pure glycol or ionic liquid solvents are used, the free proton concentration in the solution is substantially reduced, eliminating the proton reduction and other side reactions. However, techniques using ionic liquids suffer from the disadvantages of high viscosity and high cost of the solvent materials.

Electroplating of germanium on semiconductor substrates such as silicon has not been previously achieved, in part, as mentioned above, because of the susceptibility of silicon to corrosion in high pH alkaline solutions.

Also, electroplating on semiconductor substrates can be more challenging than electroplating on metallic substrates, since semiconductor substrates have a substantial electron energy band gap. Depending on the semiconductor substrate used and the chemical species in the electrolyte, certain electrochemical reactions are not even possible. In addition, even if the germanium plating on semiconductor substrates is possible, there is no reason to believe that it would ever be possible to achieve high quality epitaxial germanium by plating. The electrodeposition temperature is too low to grow crystalline germanium directly, and annealing amorphous germanium electrodeposited on silicon to induce solid phase epitaxy (SPE) templated from the silicon substrate requires an ultraclean interface between the silicon substrate and the germanium electrodeposit, a seemingly unlikely prospect in a liquid plating solution environment.

SUMMARY

The present disclosure addresses limitations and drawbacks of the above approaches for germanium deposition for semiconductor device applications.

The present disclosure relates to a semiconductor structure comprising a semiconductor substrate and regions of electroplated germanium on the semiconductor substrate. The present disclosure also relates to devices having channel regions and/or source/drain regions comprising electroplated germanium.

Another aspect of the present disclosure is concerned with electrodepositing germanium onto a semiconductor substrate such as Si, Ge, SiGe alloys, SiGeC alloys as well as III-V and II-VI semiconductor materials.

The disclosure further provides methods for transforming electrodeposited germanium into a crystalline germanium material epitaxially related to an underlying single crystal semiconductor substrate.

This disclosure additionally provides a method for depositing Ge selectively, e.g., just on the semiconductor regions of a substrate comprising insulating regions and semiconducting regions, where the semiconducting substrate regions may or may not be recessed with respect to the insulating substrate regions.

In particular, an aspect of the present disclosure relates to a method for electrodepositing germanium on exposed regions of a semiconductor substrate. The method comprises:
  obtaining a semiconductor substrate having cleaned exposed semiconductor regions;
  immersing the exposed regions in an organic electrolyte solution containing a germanium-containing solute dissolved in an organic solvent; and
  electroplating germanium from the electrolyte solution onto exposed regions to thereby form regions of electrodeposited germanium. The germanium is typically deposited directly onto a semiconductor layer.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the spirit of the disclosure. Accordingly, the description is to be regarded as illustrative in nature and not as restricted.

BRIEF DESCRIPTION OF THE DRAWINGS

These and other features of the present disclosure will become apparent upon consideration of the following detailed description of the invention when read in conjunction with the drawings, in which:

FIG. 8 shows schematic representations in cross section view of a CMOS circuit in which all the FETs may be on a high-mobility electrodeposited Ge channel layer (FIG. 8A) or in which some FETs may be on a high-mobility electrodeposited Ge channel layer and some FETs may not be (FIG. 8B);

BEST AND VARIOUS MODES FOR CARRYING OUT DISCLOSURE

The present disclosure relates to providing a semiconductor structure that comprises a semiconductor substrate and regions of electroplated germanium on the semiconductor substrate. Semiconductor substrates include Si-based and Ge-based semiconductors such as Si, Ge, SiGe alloys, SiC alloys, SiGeC alloys, as well as III-V and III-VI semiconductors, and combinations thereof. Examples of combinations of semiconductor substrates include Si based substrates with embedded regions of SiGe and/or SiC.

The semiconductor substrates to be plated on are preferably single crystal and typically suitably cleaned before the plating begins. The germanium can be blanket deposited on the semiconductor substrate or selectively deposited on semiconductor regions only of the structure. When the substrate is a patterned semiconductor substrate, it has insulating regions and semiconductor regions. The insulating regions can be on top of the semiconductor substrate and/or embedded into the semiconductor substrate.

The insulting regions can be formed from dielectrics such as silicon oxides, silicon nitrides and aluminum oxide. The electroplating method of the present disclosure can be carried out without employing a template as required in prior art techniques.

The electroplating solution typically employed according to the present disclosure contains a source of germanium ions such as germanium tetrahalide and especially germanium tetrachloride and an organic solvent such as an alkyl diol. Examples of alkyl diols are alkyl diols typically having 2-5 carbon atoms and including ethylene glycol, propylene glycol, 1,3 propanediol, butylene glycol, 1,3 butanediol and pentylene glycol. The concentration of the source of germanium is typically about 0.2 to about 0.7 moles and more typically about 0.3 to about 0.5 moles/liter; an example being about 0.5 mol/L $GeCl_4$.

The components of the electroplating solution are desirably pure and substantially (e.g.,—less than 0.1% by weight), if not entirely, free from water.

Figure 1:
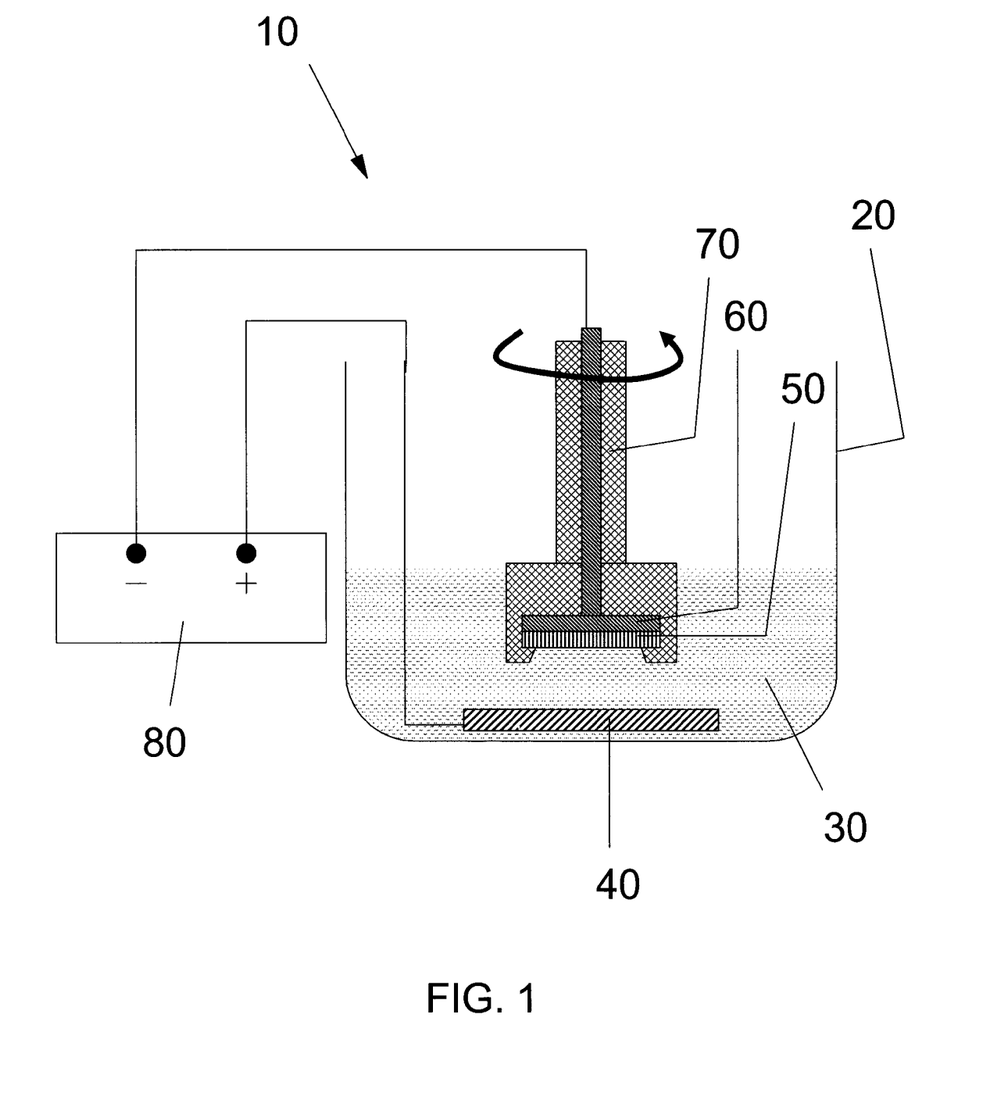
FIG. 1 shows a schematic representation of an exemplary apparatus for electrodepositing germanium on semiconductor wafer substrates.

FIG. 1 shows an example of plating apparatus 10 that may be used to implement the Ge electroplating of the present disclosure. Apparatus 10 comprises vessel 20 containing electrolyte 30 and stationary anode 40. Substrate 50 is mounted on rotating cathode 60 and immersed in electrolyte 30. Rotating cathode 60 and edges of substrate 50 are protected from the electrolyte by insulting housing 70. Power supply 80 supplies a current between anode 40 and substrate/cathode 50/60. A typical anode 40 is graphite.

The electrodeposition is typically carried out at temperatures of about 50° C. to about 90° C. and more typically at about 70 to about 80° C. The current density employed is typically about −100 to about −600 milliamps/cm$^2$, an example being about −400 milliamps/cm$^2$.

Prior to immersing the semiconductor substrate into the plating solution, the substrate is typically cleaned, such as by washing with a dilute HF (hydrofluoric acid) solution (1:100). During plating the cathode rotates at a typical rate of about 500 rpm to about 2000 rpm with an example being about 1000 rpm. The electroplating is carried in a galvanostatic mode. The plating is carried out for sufficient time to provide a germanium layer about 1 nanometer to about 200 nanometers thick and more typically about 1 nanometer to about 20 nanometers thick.

While amorphous germanium films might be desired for some applications, the electrodeposited Ge films of this disclosure are expected to be more useful when crystalline.

Figure 2A:
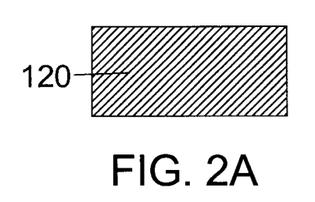
FIGS. 2A-2C show a schematic representation in cross section view of the Ge deposition and crystallization steps of the present disclosure.
Figure 2B:
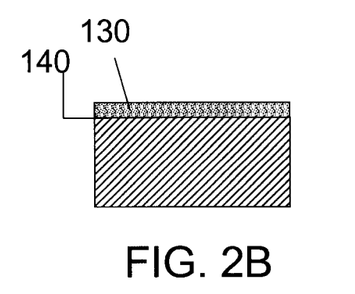
Figure 2C:
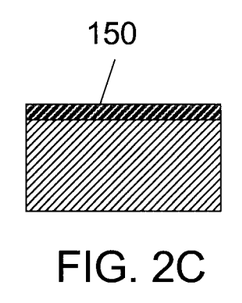

FIG. 2 shows a schematic representation in cross section view of the germanium deposition and crystallization steps of the present disclosure. FIG. 2A shows a starting crystalline semiconductor substrate 120 prior to plating. FIG. 2B shows substrate 120 after germanium plating to form amorphous germanium layer 130 separated from substrate 120 by interface 140. FIG. 2C shows the structure of FIG. 2B after a crystallization anneal converts amorphous germanium layer 130 into crystalline germanium layer 150. Depending on the quality/cleanliness of interface 140 and the lattice constant of substrate 120, crystalline germanium layer 150 may be at least partially polycrystalline (for the case of the n-GaAs substrate in Table I below) or epitaxially related to the substrate (for the case of the 100 and 111 Si substrates of Table I below).

The crystallization annealing may be performed, for instance, by known processes. Typically several hours in an inert ambient (e.g., $N_2$, He, Ar, mixtures of these gases with $H_2$) at 400-450° C. is sufficient. The temperature of the anneal is typically about 300° C. to about 600° C. and even more typically about 400 to about 450° C.

The following non-limiting examples are presented to further illustrate the present disclosure.

EXAMPLE 1

Blanket Germanium Plating on 100-oriented n-Si

The electrolyte for solution in this example 1 and the following example 2 comprises a 0.5 mol/L solution of $GeCl_4$ in 1,3-propanediol. Both chemicals are highly pure and dry. The semiconductor substrate on which the Ge is to be electrodeposited (in this case n-Si) is the cathode. The n-Si substrate is pre-cleaned with a standard RCA clean ($NH_4OH:H_2O_2$: $H_2O$=1:1:4 for 5 minutes, followed by HF:$H_2O$=1:50 for 30 seconds, followed by HCl:$H_2O_2$:$H_2O$=1:1:4 for 5 minutes). Immediately before being mounted on a rotating disk electrode, the n-Si substrate is dipped in dilute aqueous HF (1:100) for 2 minutes to remove native oxide. InGa eutectic is applied on the backside of the Si to form an ohmic contact with the rotating disk.

Figure 9:
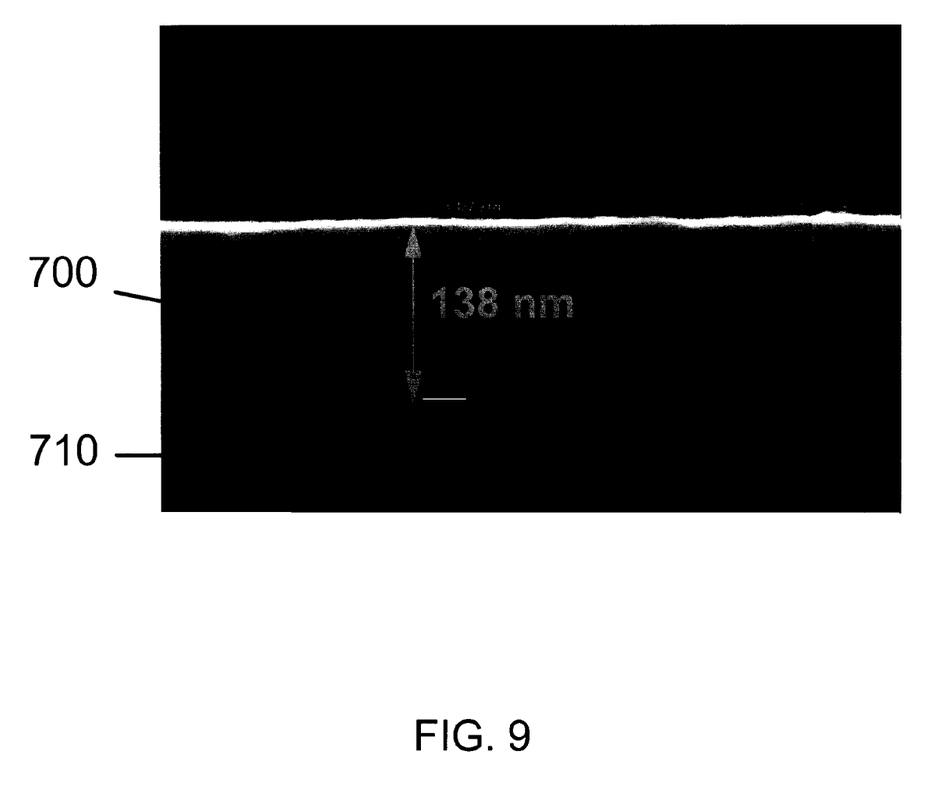
FIG. 9 shows a cross-sectional scanning electron micrograph (SEM) of a Ge film, as electrodeposited as a blanket layer on a n-Si (100) substrate.

A graphite piece is used as the anode. The cathode is rotating rate of 1000 rpm is applied to the cathode during plating. The Ge electroplating is carried out in a galvanostatic mode. A typical current of −400 mA/cm2 is used. FIG. 9 shows a cross-sectional SEM image of the 138 nm thick Ge film 700 deposited on n-Si (100) substrate 710 by electroplating for about 5 minutes.

EXAMPLE 2

Selective Plating

Figure 6A:
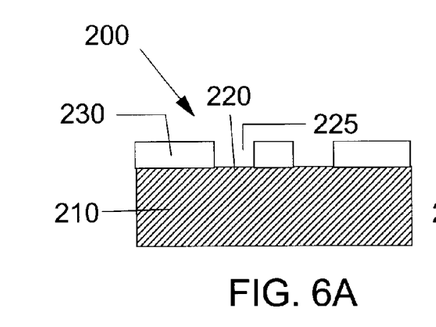
FIGS. 6A-6H show, in cross section view, examples of selective Ge deposition on the exposed semiconductor surfaces of substrates comprising patterned insulating regions on or embedded in a base semiconductor.
Figure 10:
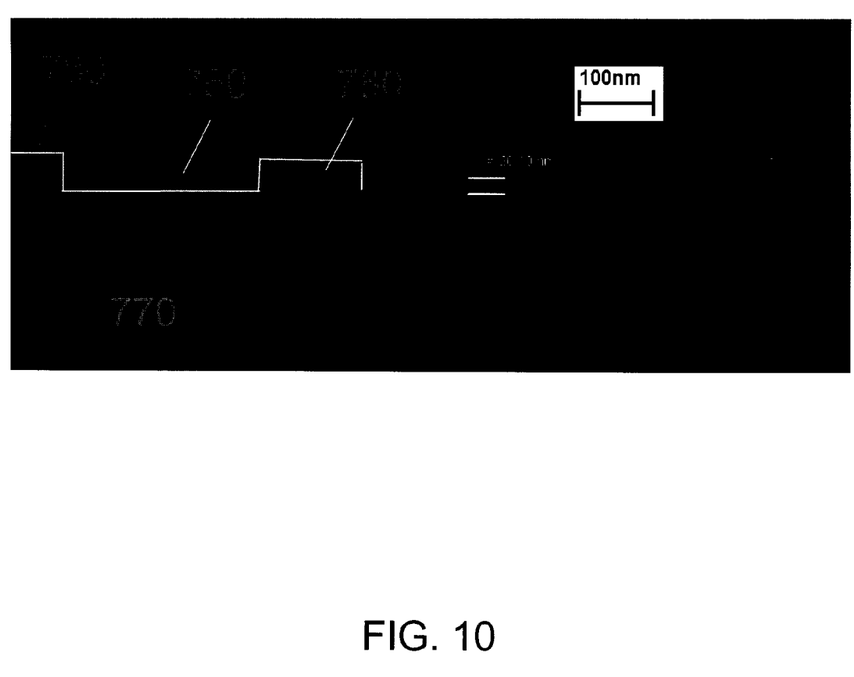
FIG. 10 shows a cross-sectional SEM of Ge selectively electrodeposited on the substrate of FIG. 6A.

FIG. 10 shows a cross-sectional SEM image of a 20 nm Ge film 750 selectively plated onto a substrate having a structure similar in cross section to that shown in FIG. 6A. The plating conditions are same as for the blanket plating in Example 1 above. The patterned insulating layer 760 comprises a bilayer of $SiO_2$ (10 nanometers, bottom) and $Si_3N_4$ (30 nanometers, top) with round openings approximately 200 nanometers in diameter. The base semiconducting substrate 770 is 100-oriented n-Si; drawn-in line 780 indicates the location of the substrate surface before the germanium plating. Germanium plating by the above procedures demonstrated on the substrate types in Table 1 (except where noted).

TABLE I

| Substrate type | Resistivity, Ω-cm | Crystal orientation | Light required for current? | Ge texture after crystallization |
|---|---|---|---|---|
| n$^+$-Si | 0.008-0.03 | 100 | No | 100 |
| n-Si | 0.6-1.5 | 100 | No | 100 |
| p$^+$-Si | 0.005-0.01 | 100 | No | 100 |
| p$^+$-Si | 0.008-0.02 | 111 | No | Weak poly-Ge plus strong 111 |
| p-Si | 9-18 | 100 | Yes | No plating |
| n-Ge | 1-2 | 100 | No | Strong Ge 100 overlapping the substrate peak |
| n-GaAs | 0.002-0.003 | 100 | No | Weak poly-Ge plus strong Ge 100 overlapping the substrate peak |

The absence of plating on p-Si substrate is deemed to be due to the very low doping which in turn results in the relatively high resistivity. The resistivity of the substrate is typically desirably less than 3 Ω-cm and more typically less than 2 Ω-cm.

Figure 3:
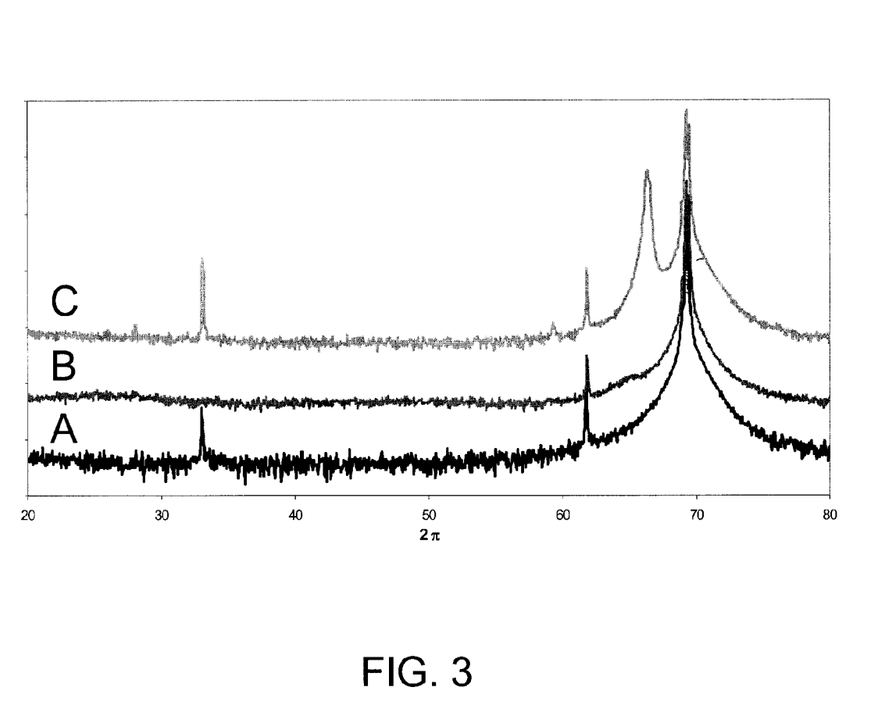
FIG. 3 shows the x-ray diffraction spectra of a $n^+$-Si (100) substrate before Ge electrodeposition (curve A), after Ge electrodeposition (curve B), and after a Ge crystallization anneal (curve C)
Figure 4:
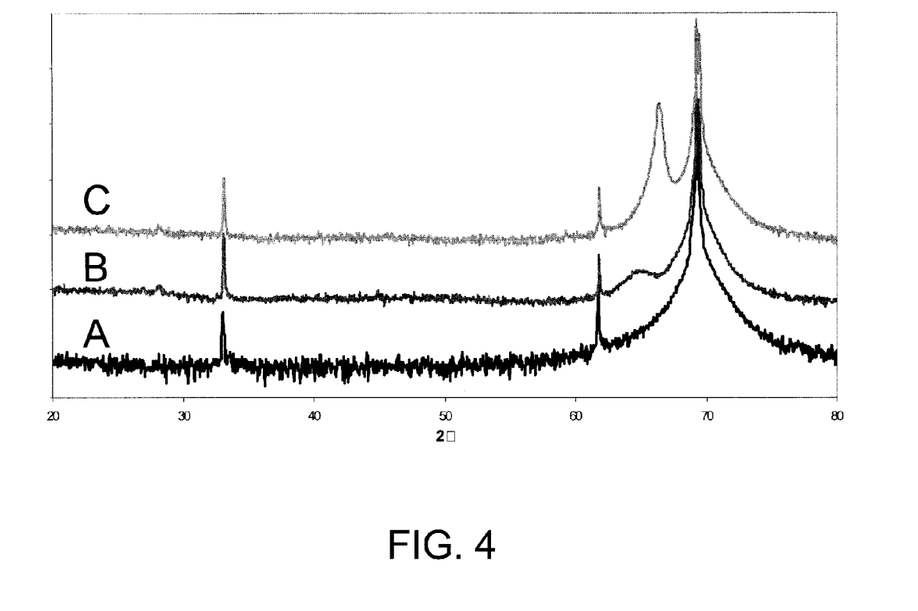
FIG. 4 shows the x-ray diffraction spectra of a $p^+$-Si (100) substrate before Ge electrodeposition (curve A), after Ge electrodeposition (curve B), and after a Ge crystallization anneal (curve C)
Figure 5:
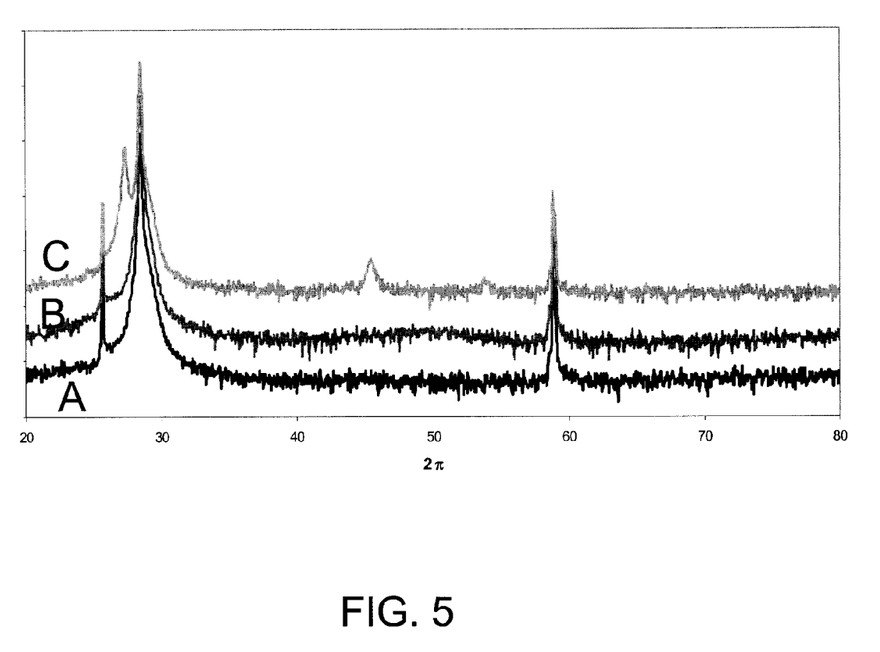
FIG. 5 shows the x-ray diffraction spectra of a $p^+$-Si (111) substrate before Ge electrodeposition (curve A), after Ge electrodeposition (curve B), and after a Ge crystallization anneal (curve C)

FIG. 3-5 show x-ray diffraction (XRD) spectra for Ge films electrodeposited on three different substrates. A Bragg-Brentano geometry is used with Cu Kα radiation (λ=1.54 Å). The intensity scale is logarithmic and the three curves (A, B, and C) are displaced vertically to make them easier to see. Curve A (bottom) shows the substrate before Ge electrodeposition, curve B (middle) shows the as-deposited Ge film, and curve C (top) shows the Ge film after annealing in He at 400° C. for 4 hours.

FIG. 3 shows an x-ray diffraction spectrum of an electrodeposited Ge film of thickness about 140 nanometers on a 100-oriented n$^+$-Si substrate. Curve 3A shows only the peaks of the Si substrate; curve 3B shows a hint of a weak broad peak at 2θ~65° indicating possible formation of a nanocrystalline phase, and curve 3C shows a strong peak at 2θ~66° corresponding to the 400 reflection of Ge, suggesting templated crystallization from the substrate.

FIG. 4 shows nearly identical results for a Ge film 140 nanometers in thickness plated on a 100-oriented p$^+$-Si substrate.

FIG. 5 shows the X-ray diffraction results for a Ge film 140 nm in thickness plated on a 111-oriented p$^+$-Si substrate. Curve 5A shows only the peaks of the Si substrate; and curve 5C shows that in this case the recrystallization is not perfectly matched to the substrate. While the Ge peak having the substrate orientation is still by far the strongest peak, weak Ge reflections from crystal grains having other orientations are also present. Incidentally, high resolution x-ray diffraction data indicates that the electrodeposited Ge may be under tensile strain after crystallization, with the amount of strain ranging from about 0.1 to 0.4% over range of substrates and plated Ge thicknesses (40-200 nanometers) examined.

FIG. 6 shows, in cross-sectional view, examples of selective Ge electrodeposition on the exposed semiconductor surfaces of substrates comprising patterned insulating regions on or embedded in a base semiconductor. Substrate structure 200 of FIG. 6A comprises base semiconductor 210 having exposed semiconductor surface regions 220 in openings 225 of patterned insulating layer 230 disposed on base semiconductor 210's top surface. FIGS. 6B-6D show substrate structure 200 after different amounts of Ge have been electrodeposited onto exposed semiconductor surface regions 220. In FIG. 6B, the top surface of electrodeposited Ge 240 remains below the top surface of patterned insulating regions 220. In FIG. 6C, the top surface of electrodeposited Ge 250 is even with the top surface of patterned insulating regions 220. In FIG. 6D, the top surface of electrodeposited Ge 240 extends above the top surface of patterned insulating regions 220 and exhibits a characteristic mushroom shape. For device applications it is expected that the overfilled geometry of FIG. 6D would be less preferred than the underfilled geometry of FIG. 6B or the even fill geometry of FIG. 6C.

Figure 6B:
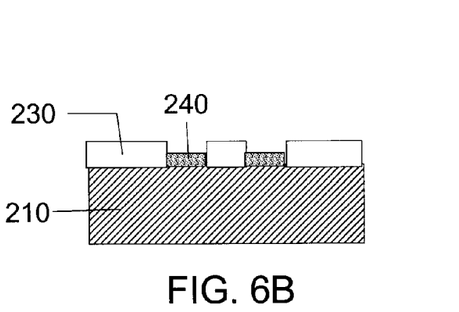
Figure 6C:
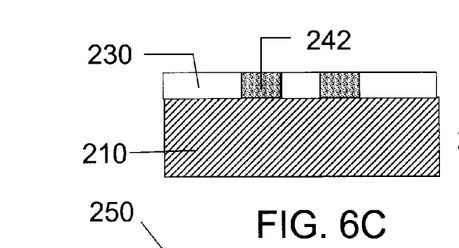
Figure 6D:
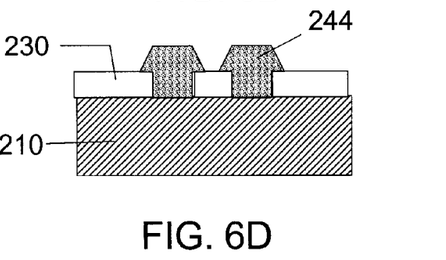
Figure 6E:
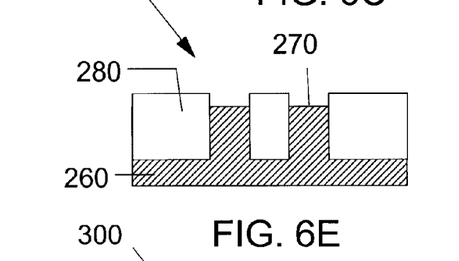
Figure 6F:
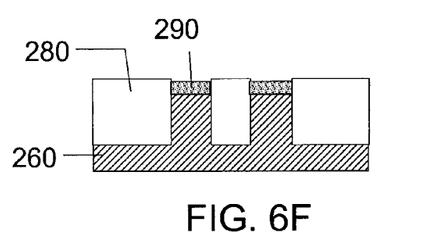

Substrate structure 250 of FIG. 6E comprises base semiconductor 260 having exposed semiconductor surface regions 270 and embedded patterned insulating regions 280 which may extend above the top surface of base semiconductor 260 (as shown) or be even with or below the top surface of base semiconductor 260 (not shown). FIG. 6F shows substrate structure 250 after Ge electrodeposition on exposed semiconductor substrate regions 270 to leave the top surface of electrodeposited Ge 290 even with the top surface of embedded insulating regions 280. As shown in FIGS. 6B and 6D, the amount of plating may be adjusted to leave the surface of the electrodeposited Ge above or below the top surface of embedded insulating regions 280.

Figure 6G:
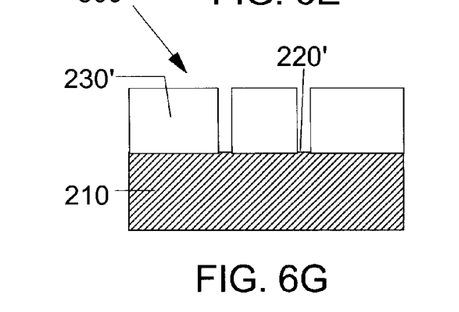
Figure 6H:
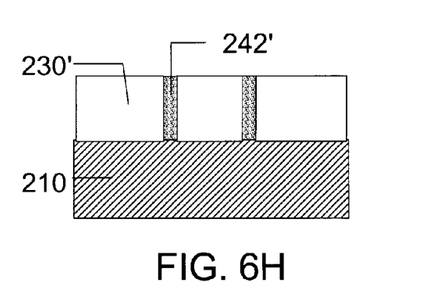
Figure 7A:
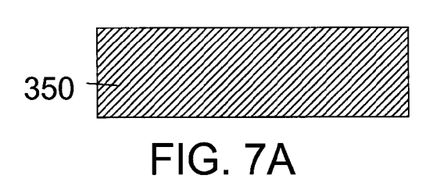
FIGS. 7A-7F show, in cross section view, examples of selective Ge deposition using through-mask plating.
Figure 7B:
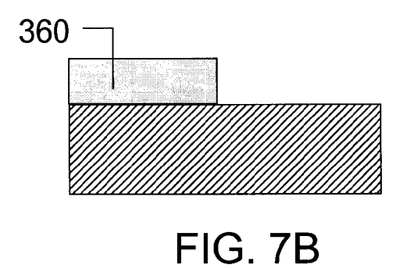
Figure 7C:
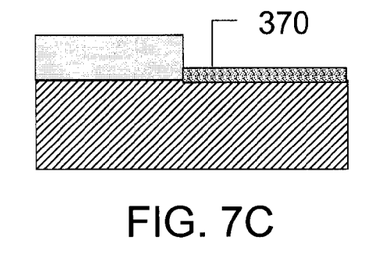
Figure 7D:
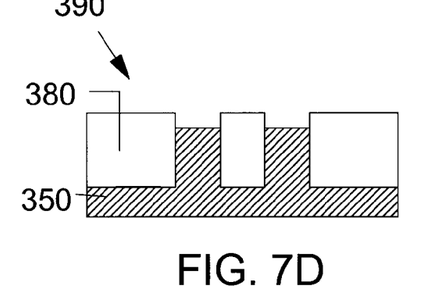
Figure 7E:
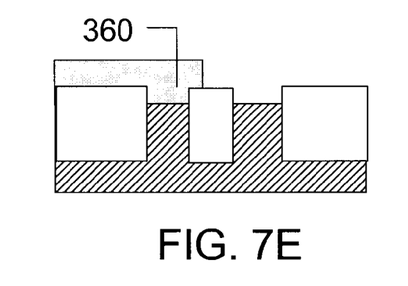
Figure 7F:
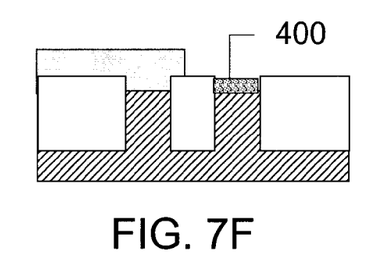

Substrate structure 300 of FIG. 6G differs from substrate structure 200 of FIG. 6A only in the aspect ratios of openings 225' in patterned insulating layer 230'; openings 225 in structure 200 of FIG. 6A are shallow and wide (to provide a film-shaped Ge deposit) whereas openings 225' in structure 300 of FIG. 6G are deep and narrow (to provide wire-like or wall-like Ge deposits).

Patterned insulating layers or regions 230, 230', and 280 would typically be formed from silicon dioxide, silicon nitride, and other suitable similar dielectric materials, mixtures of these materials, or layered combinations of these materials. At least some portion of these patterned insulating regions would typically be left in the final structure.

FIG. 7 shows, in cross section view, examples of selective Ge deposition on semiconductor base substrate 350 using through-mask plating with disposable patterned masking layer 360. FIGS. 7A-7C illustrate a case in which plating occurs on all substrate regions not masked by the disposable masking layer. FIG. 7A shows the starting substrate 350, FIG. 7B shows substrate 350 after application of patterned masking layer 360, and FIG. 7C shows the structure of FIG. 7B after electrodeposition of Ge layer 370. FIGS. 7D-7F illustrate a case in which plating occurs in only some of the substrate regions not masked by a disposable masking layer, because plating in non-masked regions is blocked by patterned insulating regions, in this case embedded insulating regions 380. FIG. 7D shows the starting substrate 390, FIG. 7E shows substrate 390 after application of patterned masking layer 360, and FIG. 7F shows the structure of 7E after electrodeposition of Ge layer 400. Patterned disposable masking layer 360 would typically be formed from an insulating photoresist and would typically be removed after plating and before any Ge crystallization anneals.

Figure 8A:
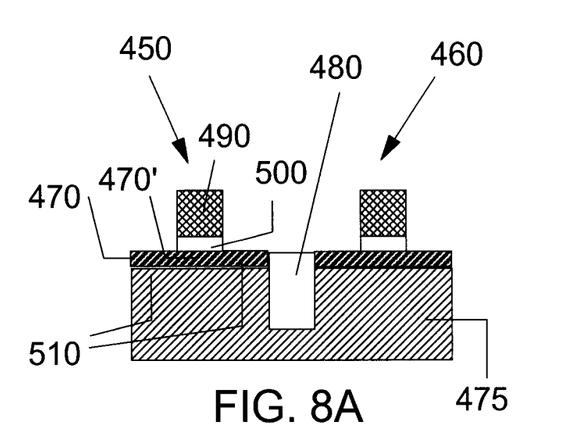

Another embodiment of this disclosure provides FET devices (and the CMOS in which they may be contained) having channel regions of electroplated Ge. FIG. 8A shows a schematic representation in cross section view of a CMOS circuit in which both n-channel FETs (nFETs) 450 and p-channel FETs (pFETs) 460 are disposed on high-mobility electrodeposited Ge channel layers 470 on semiconducting base substrate 475. nFETs/pFETs 450/460 are separated by insulating isolation regions 480 and comprise conductive gate electrodes 490, gate dielectric layers 500 under the gate electrodes 490 and above Ge channel regions 470', and source/drain regions 510 adjacent to channel regions 470'. A starting point for the structure of FIG. 8A can be a substrate structure along the lines of that shown in FIG. 6F after a Ge crystallization anneal. If desired, additional performance-enhancing features may be introduced to FETs 450 and/or 460 such as, for example, embedded source/drain regions comprising materials other than Ge, stress liners, sidewall spacers, and the like.

Figure 8B:
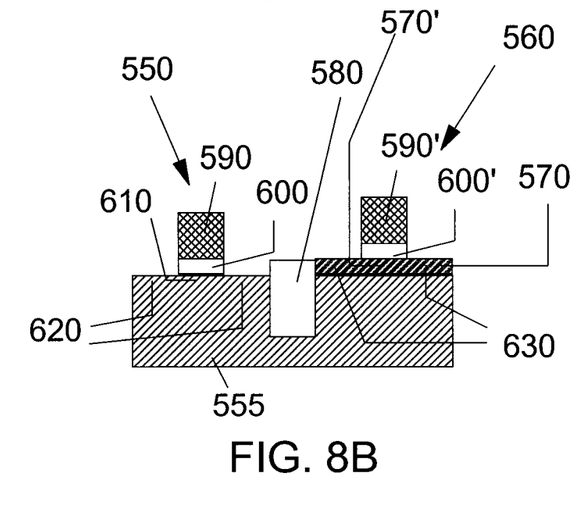

FIG. 8B shows a schematic representation in cross section view of a CMOS circuit in which nFETs 550 are disposed directly on semiconducting substrate 555 and pFETs 560 are disposed on high-mobility electrodeposited Ge channel layers 570. nFETs/pFETs 550/560 are separated by insulating isolation regions 580 and comprise conductive gate electrodes 590 and 590', gate dielectric layers 600 and 600' under the gate electrodes and above channel regions 610 and 470", and source/drain regions 620 and 630. A starting point for the structure of FIG. 8B might be a substrate structure like that shown in FIG. 7F after masking layer removal and a Ge crystallization anneal. If desired, additional performance-enhancing features may be introduced to FETs 550 and/or 560 such as, for example, embedded source/drain regions comprising materials different from the materials of channels 470' and/or 610, stress liners, sidewall spacers, etc.

It should be noted that the selective deposition methods described in FIGS. 6 and 7 may also be used to form embedded source/drain regions of plated Ge. For example, source/drain regions 620 of FET 550 in FIG. 8B may be recessed and replaced by plated Ge. Gate 590 would typically be capped with an insulator and laterally protected by insulating sidewall spacers to reduce to the possibility of undesired Ge deposition on gate 590 from plating current tunneling through gate dielectric 600.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In this case of inconsistencies, the present disclosure will prevail.

What is claimed is:

1. A semiconductor structure, comprising;
    a patterned single-crystal semiconductor substrate comprising insulating regions and semiconducting regions at a surface of the semiconductor substrate; and
    regions of electroplated germanium provided selectively at the semiconducting regions of the semiconductor substrate,
    wherein the regions of electroplated germanium have a thickness of about 1 nanometer to about 20 nanometers, and
    wherein the insulating regions extend above the top surface of the semiconductor substrate and the semiconducting regions are recessed with respect to the insulating regions.

2. The semiconductor structure of claim 1 being a field effect transistor (FET).

3. The semiconductor structure of claim 2 wherein the FET has a channel and the channel comprises the electroplated germanium.

4. The semiconductor structure of claim 2 wherein the FET has a source and a drain region which comprise the electroplated single-crystal germanium.

5. The semiconductor structure of claim 1 being a complementary metal oxide semiconductor (CMOS) circuit comprising at least one FET comprising regions of the electroplated singles-crystal germanium.

6. The semiconductor structure of claim 1 wherein the semiconductor substrate is selected from the group consisting of Si, Ge, SiGe, SiC, SiGeC, III-V material, and II-VI materials and layered combinations thereof.

7. The semiconductor structure of claim 1 wherein the semiconductor substrate is selected from the group consisting of Si, Ge, and GaAs.

8. The semiconductor structure of claim 1 wherein said substrate is a Si based substrate with embedded regions of SiGe or SiC or both.

9. The semiconductor structure of claim 1 wherein said insulating regions comprise a dielectric selected from the group consisting of silicon oxides, silicon nitrides and aluminum oxide.

10. The semiconductor structure of claim 1 wherein the regions of electroplated single-crystal germanium are epitaxially related to the single semiconductor substrate.

11. The semiconductor structure according to claim 1, wherein the regions of electroplated germanium underfill a recess formed by the insulating regions extending above the top surface of the semiconductor substrate.

12. The semiconductor structure according to claim 1, wherein the regions of electroplated germanium are free from dislocations.

13. The semiconductor structure according to claim 1, wherein the regions of electroplated germanium are single-crystalline.

* * * * *